(12) United States Patent
Choi et al.

(10) Patent No.: US 7,558,133 B2
(45) Date of Patent: **\*Jul. 7, 2009**

(54) SYSTEM AND METHOD FOR CAPTURING DATA SIGNALS USING A DATA STROBE SIGNAL

(75) Inventors: Joo S. Choi, Yongin (KR); James B. Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 17 days.

This patent is subject to a terminal disclaimer.

(21) Appl. No.: 11/901,053

(22) Filed: Sep. 14, 2007

(65) Prior Publication Data

US 2008/0025116 A1    Jan. 31, 2008

Related U.S. Application Data

(62) Division of application No. 11/116,630, filed on Apr. 26, 2005, now Pat. No. 7,280,417.

(51) Int. Cl.
*G11C 7/00* (2006.01)
*G11C 7/10* (2006.01)
*G11C 8/18* (2006.01)

(52) U.S. Cl. ............. 365/193; 365/189.03; 365/189.05; 365/233.5; 365/220; 365/221

(58) Field of Classification Search ............ 365/189.01, 365/189.05, 191, 193, 194, 220, 221
See application file for complete search history.

(56) References Cited

U.S. PATENT DOCUMENTS

| 6,198,674 | B1 | 3/2001 | Kim | 365/193 |
|---|---|---|---|---|
| 6,215,710 | B1 | 4/2001 | Han et al. | 365/193 |
| 6,240,042 | B1 | 5/2001 | Li | 365/233 |
| 6,288,971 | B1 | 9/2001 | Kim | 365/233 |
| 6,327,206 | B2 | 12/2001 | Kubota et al. | 365/219 |
| 6,381,194 | B2 | 4/2002 | Li | 365/233 |
| 6,421,291 | B1 | 7/2002 | Watanabe et al. | 365/219 |
| 6,512,704 | B1 | 1/2003 | Wu et al. | 365/189.07 |
| 6,529,993 | B1 | 3/2003 | Rogers et al. | 711/105 |
| 6,615,345 | B1 | 9/2003 | LaBerge | 713/100 |
| 6,671,211 | B2 | 12/2003 | Borkenhagen et al. | 365/189.05 |
| 6,680,866 | B2 | 1/2004 | Kajimoto | 365/189.01 |
| 6,728,144 | B2 | 4/2004 | Nygren | 365/193 |
| 6,853,594 | B1 | 2/2005 | Wu et al. | 365/193 |
| 6,922,367 | B2 | 7/2005 | Morzano et al. | 365/193 |

(Continued)

*Primary Examiner*—Ly D Pham
(74) *Attorney, Agent, or Firm*—Dorsey & Whitney LLP

(57) ABSTRACT

A signal capture system and method is used to capture a data signal using a data strobe signal having a preamble of strobe signal transitions. The system includes a data latch circuit receiving the data signal. The data latch circuit is clocked by transitions of the data strobe signal to capture respective bits of data corresponding to the data signal. A decoder receives a memory command signal and generates a data start signal after a delay period from receiving the memory command signal if the command signal corresponds to a read or a write command. The receipt of read or write command signals is used by a control circuit to identify the start of valid read or write data signals. The control circuit then outputs the captured data signals responsive to the data start signal, thereby ignoring the transitions in the preamble of the data strobe signal.

17 Claims, 5 Drawing Sheets

U.S. PATENT DOCUMENTS

| | | |
|---|---|---|
| 6,940,321 B2 | 9/2005 | Heo et al. .................... 327/112 |
| 6,940,760 B2 | 9/2005 | Borkenhagen et al. . 365/189.05 |
| 7,002,378 B2 | 2/2006 | Srikanth et al. ............... 327/50 |
| 7,020,031 B2 | 3/2006 | Shin et al. ................... 365/193 |
| 7,068,549 B2 | 6/2006 | Cho ........................... 365/193 |
| 7,092,312 B2 * | 8/2006 | Choi et al. ............. 365/189.14 |
| 2003/0031081 A1 | 2/2003 | Suzuki et al. ............... 365/233 |
| 2005/0007836 A1 | 1/2005 | Morzano et al. ............ 365/193 |
| 2005/0062864 A1 * | 3/2005 | Mabuchi ..................... 348/294 |
| 2005/0232063 A1 | 10/2005 | Na et al. ...................... 365/233 |
| 2006/0044892 A1 | 3/2006 | Hsieh et al. ................. 365/193 |
| 2006/0083081 A1 | 4/2006 | Park et al. ................... 365/191 |
| 2006/0139080 A1 | 6/2006 | Park ........................... 327/291 |
| 2006/0193413 A1 | 8/2006 | Shandilya et al. ........... 375/355 |
| 2006/0203573 A1 | 9/2006 | Kim et al. ................... 365/193 |

* cited by examiner

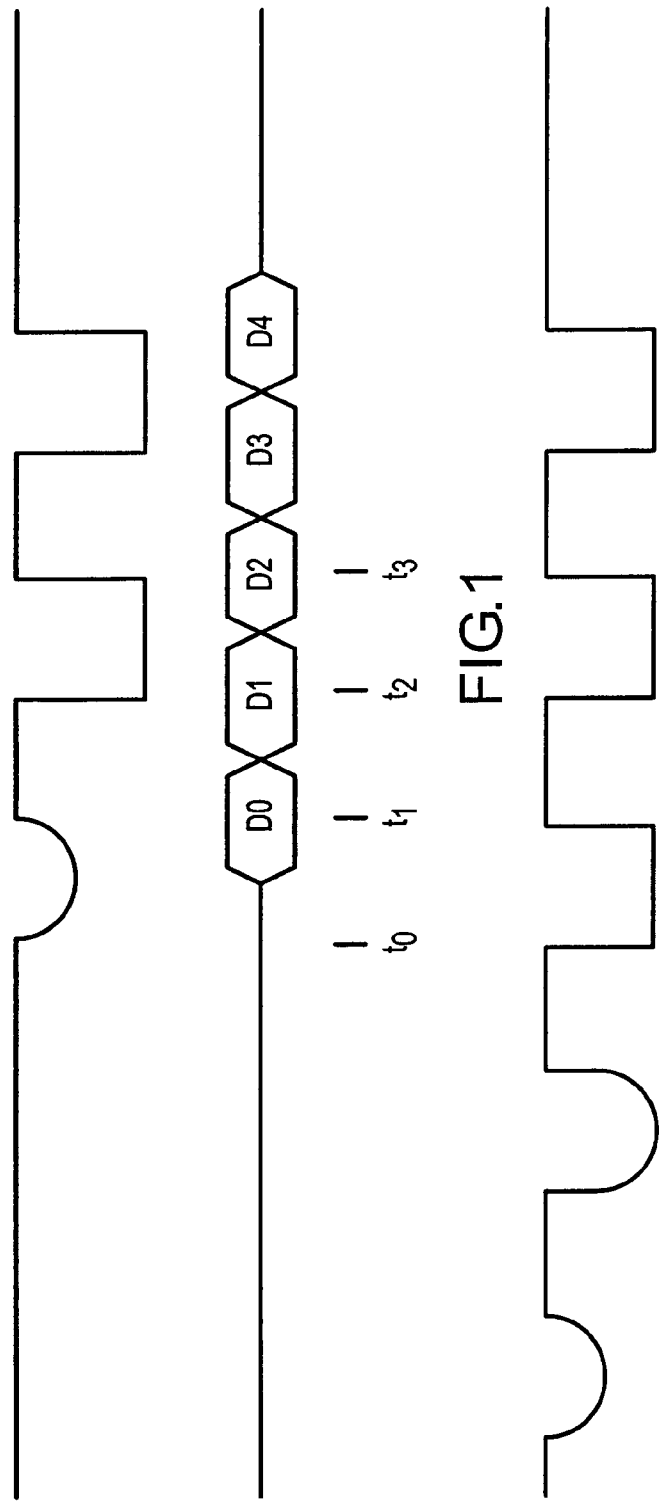
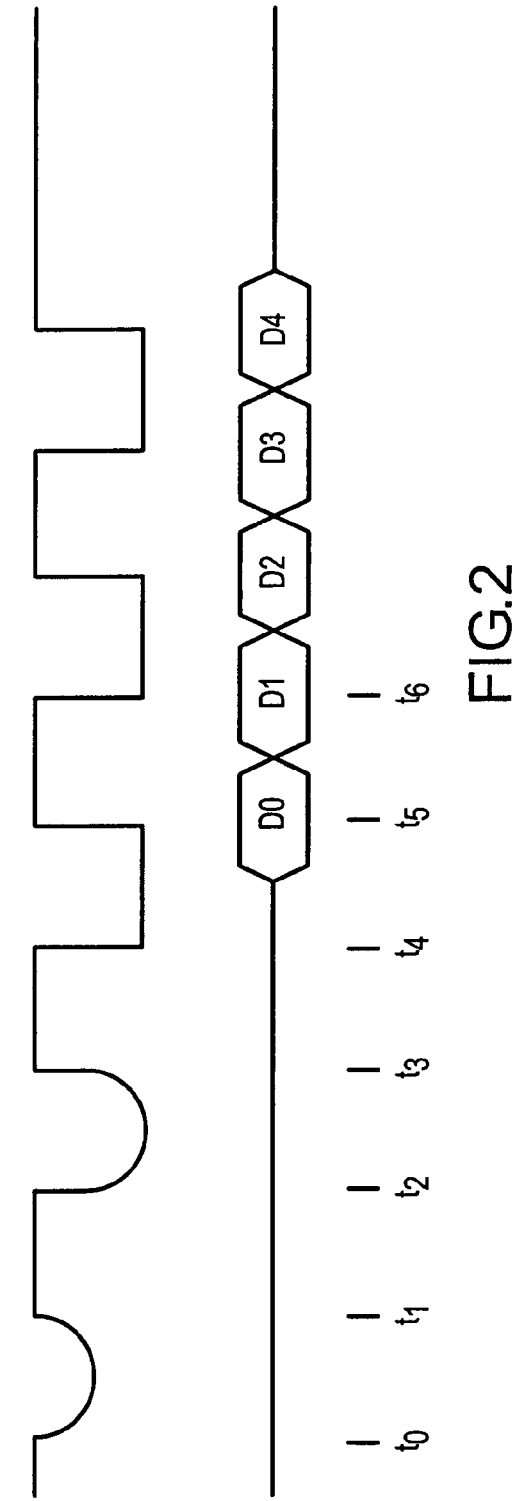
FIG.1
FIG.2

SYSTEM AND METHOD FOR CAPTURING DATA SIGNALS USING A DATA STROBE SIGNAL

CROSS-REFERENCE TO RELATED APPLICATIONS

This application is a divisional of U.S. patent application Ser. No. 11/116,630, filed Apr. 26, 2005, U.S. Pat. No. 7,280,417.

TECHNICAL FIELD

This invention relates to digital devices such as memory devices, and, more particularly, to a method and system for allowing digital data coupled between two devices to be accurately captured at the receiving device by a high-speed clock signal.

BACKGROUND OF THE INVENTION

Periodic digital signals are commonly used in a variety of electronic devices. Probably the most common type of periodic digital signals are clock signals that are typically used to establish the timing of a digital signal or the timing at which an operation is performed on a digital signal. For example, data signals are typically coupled to and from memory devices, such as synchronous dynamic random access memory ("SDRAM") devices, in synchronism with a data strobe signal. The data strobe signal typically has a phase that is aligned with a system clock signal. Write data signals are typically coupled from the memory controller in synchronism with a write data strobe signal. The write data signals are typically the quadrature of the write strobe signal so that the write data strobe signal transitions between two logic levels during a "data eye" occurring at the center of the period in which the data signals are valid. The write data strobe signal can therefore be used by the memory device to latch or "capture" the write data. Read data signals are typically coupled from a memory device in synchronism with a read data strobe signal. The read data signals typically have the same phase as the read data strobe signal. However, the read data strobe signal is normally used by the memory controller to generate a quadrature signal that can be used by the memory controller to "capture" the read data.

As the speed of memory devices has continued to increase, the "data eye" has become smaller and smaller, thus making the timing of the data strobe signals relative to the timing of the data signals even more critical. One difficulty that has been encountered in ensuring that data strobe signals transition at the proper time is the variability in quality of the data strobe signal. In particular, when a data strobe signal line has been idle, the first data strobe signal typically does not have well defined transitions, as shown at times $t_0$ and $t_1$ in FIG. 1. The difficulty in transitioning the data strobe signal line when the line has been idle results from the line becoming heavily charged to a bias voltage, typically one-half the supply voltage Vcc in a center tapped termination ("CTT") system or the supply voltage Vcc in an alternative ("VDD") system. However, after the initial data strobe pulse, the transitions of the data strobe signal become well defined at time $t_2$, $t_3$ and subsequent times. At the relatively slow operating speeds of conventional memory devices, the relatively undefined transitions of the initial data strobe pulse are still able to capture the data signals. However, as the operating speeds of memory devices continues to increase, it is becoming increasingly difficult for the data strobe signal to capture the first bit or two of data.

One approach that has been used to avoid the problems created by the relatively undefined transitions of the initial data strobe signals is to provide a "preamble" prior to the receipt of valid data signals during which unused data strobe signals are transmitted. As shown in FIG. 2, a preamble of two data strobe signals transitioning at times $t_0$, $t_1$, $t_2$ and $t_3$ precede a strobe signal transitioning at time $t_4$ which is used to capture valid data. As shown in FIG. 2, the transitions occurring at time $t_0$ and $t_1$ are not well defined, and the transitions occurring at times $t_2$ and $t_3$ are less well defined by subsequent transitions. However, the transitions occurring at time $t_5$ and subsequent times are well defined, and can therefore be used to more accurately capture the data signals.

Unfortunately, it can be difficult to determine when valid data signals are being received, and it can be difficult to differentiate actual data strobe signals from data strobe signals occurring in the preamble. This difficulty is exacerbated by the fact that strobe signals preambles are not needed when data transfers occur on a sequential basis, e.g., two write accesses in a row, thus making the data strobe signal continuously present. In fact, providing a preamble under these circumstances would reduce the data bandwidth of the memory device because no data would be transferred during the unnecessary preamble. For example, as shown in FIG. 2, if data signals were being captured prior to time to, the presence of the preamble between times $t_0$ and $t_4$ would waste over two clock periods of time.

Another problem with proposed data strobe preamble schemes results from the fact that the data strobe signals are in a clock domain that is different from the clock domain of the system clock signal and command signals. The timing relationship between the data strobe signal and the start of valid data signals is therefore not easily determined and can vary considerably. For example, although the system clock signal is in general alignment with the data strobe signal, the specification for typical SDRAM memory devices allows this timing relationship to vary by plus or minus one-quarter period of the CLK signal. Insofar as the command signals are in the same clock domain as the system clock signal, the timing relationship between the data strobe signals and the command signals can vary in this same manner. Also, depending on signal termination techniques and system frequency, false or missing toggles could be present on the data strobe compromising reliability of initial strobe toggles. As a result, it is not possible, for example, to simply delay for two transitions of the data strobe signal after receipt of a command signal before using the data strobe signal to capture data signals. At the relatively slow operating speeds of conventional memory devices, it has generally been possible to determine when valid data signals are being received and should therefore be captured by received data strobe signals. However, with ever increasing operating speeds of memory devices, it is becoming increasingly difficult to make this determination.

There is therefore a need for a method and system of allowing read and write data signals to be accurately captured when a memory device is operating at a very high rate of speed.

SUMMARY OF THE INVENTION

A system and method for capturing a data signal that uses a data strobe signal having transitions that are synchronized to respective bits of the data signal. The data strobe signal has a preamble of transitions immediately preceding the transitions that are synchronized to respective bits of the data signal so that the transitions that are synchronized to the data signal are well defined. The data signals are applied to a data latch, which is clocked by transitions of the data strobe signal. Command signals are also received and decoded to determine if they correspond to a predetermined data transfer, such as a write data transfer. If so, the captured data signals are output to a predetermined period after the command signals were received. By using the receipt of command signals corresponding to the predetermined data transfer to identify the timing of valid data signals that should be captured, signals that are captured by transitions of the data strobe transitions in the preamble are ignored.

BRIEF DESCRIPTION OF THE DRAWINGS

FIG. 1 is a timing diagram showing a first proposed write data strobe signal and its timing relationship to write data.

FIG. 2 is a timing diagram showing a second proposed write data strobe signal and its timing relationship to write data.

DETAILED DESCRIPTION

Figure 3:
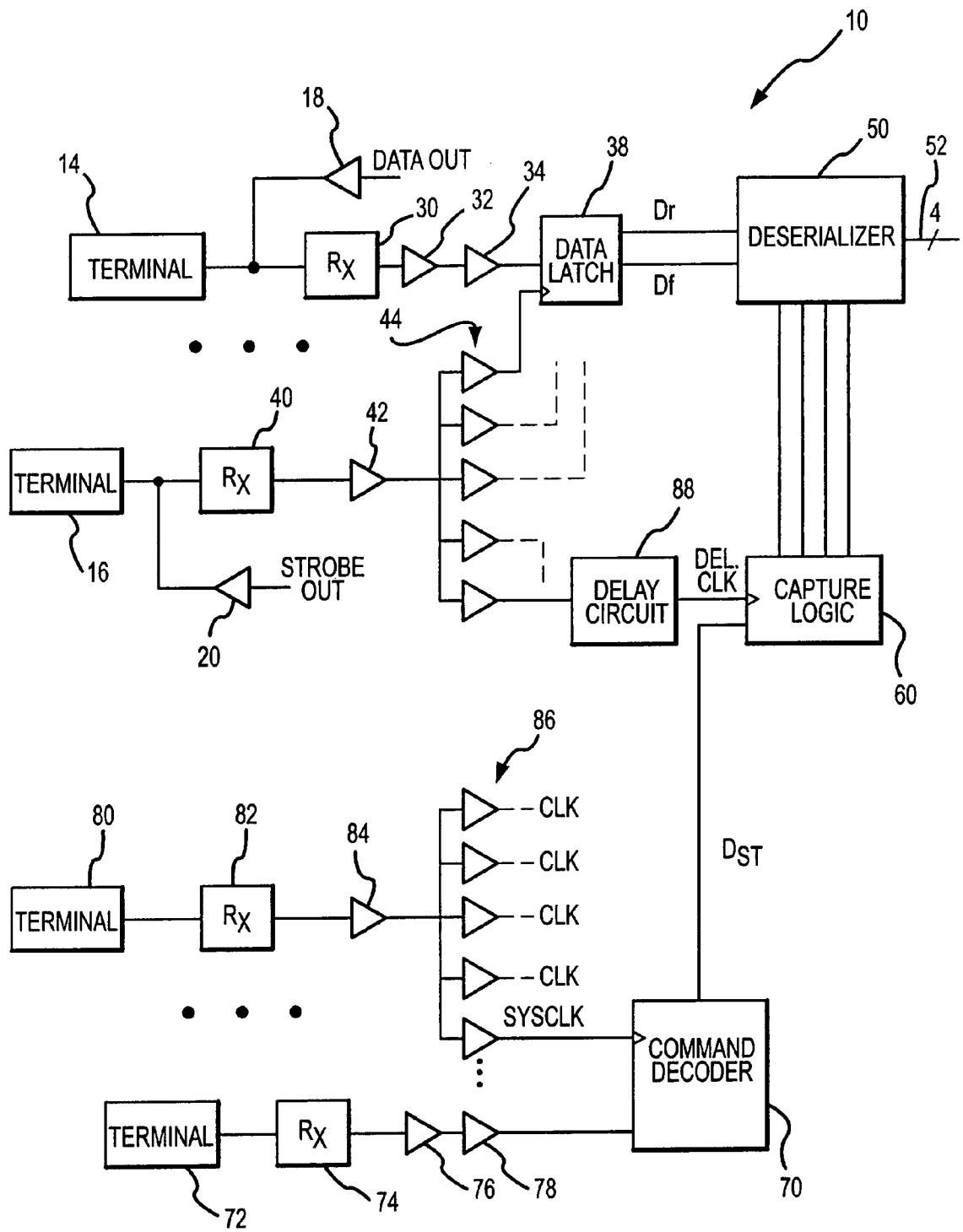
FIG. 3 is a block diagram of a data signal capture system according to one embodiment of the invention.

One embodiment of a system 10 for allowing write data signals to be captured in a memory device using a write data strobe signal is shown in FIG. 3. The system 10 includes several data bus terminals 14 (only one of which is shown in FIG. 3) and a terminal 16 receiving a write strobe signal. Write data signals corresponding to a bit of write data are applied to the data bus terminal 14, generally from a memory controller (not shown in FIG. 3). Read data signals corresponding to a bit of read data are coupled to the data bus terminal from internal circuitry (not shown in FIG. 3) through a data driver 18. Similarly, a read data strobe signal is coupled to the terminal 16 through a strobe driver 20.

The write data signals applied to the data bus terminal 14 are coupled through a receiver 30 and a pair of drivers 32, 34 to a data input of a data latch 38. The write strobe signal is coupled through a similar receiver 40 and a first driver 42. The driver 42 has sufficient drive capability to drive a plurality of second drivers 44. An output of one of these drivers is coupled to a clock input of the data latch 38.

In operation, the rising and falling edges of the write strobe signal cause write data signals coupled to the data input of the latch 38 to be captured. The latch 38 then outputs a signal corresponding to the data signal captured by the rising edge of the write data strobe signal on a Dr output. Similarly, the latch 38 outputs a signal corresponding to the data signal captured by the falling edge of the write data strobe signal on a Df output. The system 10 is designed so that the propagation delay from the data bus terminal 14 to the data input of the latch 38 is the same as the propagation delay from the data strobe terminal 16 to the clock input of the latch 38. Thus, the drivers 32, 34 through which the write data signals are coupled compensates for the drivers 42, 44 through which the write strobe signal is coupled. As a result, the write strobe is able to accurately capture the write data signals coupled to the data input of the latch 38.

The Dr and Df data signals at the output of the latch 38 are coupled to a deserializer 50. The deserializer 50 stores write data signals corresponding to 4 bits of data captured in the latch 38 responsive to 4 transitions of the write strobe signal. The deserializer 50 then outputs the stored signals corresponding to the 4 bits of data on a four-bit bus 52. As mentioned above, several write data signals corresponding to respective bits are applied to respective data bus terminals 14.

Therefore, the system 10 includes the component shown in FIG. 3 for each data bus terminal 14. For example, the system 10 includes a memory device having a 16-bit data bus would have 16 data latches 38 and 16 deserializers 50.

In operation, a preamble of at least one write strobe signal is applied to the terminal 16 prior to valid write data being applied to the data bus terminal 14. As explained above the write stored signals occurring in the preamble may have transitions that are not well defined. However, after the write strobe signals in the preamble have been received, the write strobe signal has well defined transitions, and can therefore accurately capture valid write data applied to the data bus terminal 14 after the preamble.

As explained above, it can be difficult to determine when the received write strobe signals should be used to start capturing write data signals applied to the data bus terminal 14. For this purpose, the deserializer 50 is controlled by the control signals generated by capture logic 60. The capture logic 60 receives a data start signal $D_{ST}$, and it is clocked by the write strobe signal coupled through the receiver 40 and drivers 42, 44.

The data start signal $D_{ST}$ is generated by a command decoder 70, which captures a command signal applied to a terminal 72 and coupled through a receiver 74 and drivers 76, 78. The command decoder 70 captures the command signal responsive to a transition of delayed clock SYSCLK signal. The SYSCLK signal is generated by coupling the system clock CLK signal applied to a terminal 80 through a receiver 82 and drivers 84, 86. In the event the captured command signals correspond to a write command, the command decoder 70 outputs an active data start $D_{ST}$ signal. Up until that time, the deserializer 50 has ignored the data signals Dr and Df output from the data latch 38. When the data start $D_{ST}$ signal is received by the capture logic 60, the capture logic 60 initiates storing the data signals Dr and Df by the deserializer 50.

Figure 4:
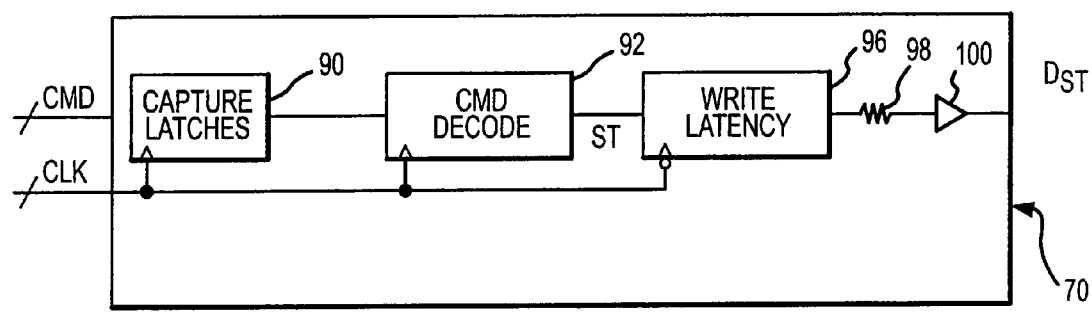
FIG. 4 is a block diagram of one embodiment of a command decoder used in the data signal capture system of FIG. 3.

One embodiment of the command decoder 70 is shown in FIG. 4. However, it should be understood that various components of the command decoder 70 are not shown in FIG. 4 for purposes of clarity and brevity. The command decoder 70 includes a capture latch 90 to having a data input coupled to the output of the drivers 78 (FIG. 3). A clock input of the capture latch 90 is coupled to the output of the driver 86 to receive the system clock CLK signal. As explained above, the capture latch 90 captures command signals responsive to transitions of the CLK signal. Although only one capture latch 90 is shown in FIG. 4, it should be understood that several command signals are typically coupled to a memory device. Therefore, several capture latches 90 would be included in the command decoder 70, although only one capture latch 90 is shown in FIG. 4 for purposes of clarity.

The captured command signals from the latches 90 are applied to a command decoder 92. The command decoder latches the captured command signals from the latches 90 responsive to the system clock CLK signal. The command decoder 92 then uses conventional logic circuitry to generate a start ST signal in the event a write command is decoded. The start ST signal is applied to a write latency delay circuit 96, which then generates the data start $D_{ST}$ signal responsive to the falling edge of the CLK signal after a delay corresponding to the write latency of the memory device. As previously mentioned, the data start signal $D_{ST}$ causes the deserializer capture logic 60 to start the deserialization process at the deserializer 50.

Figure 5:
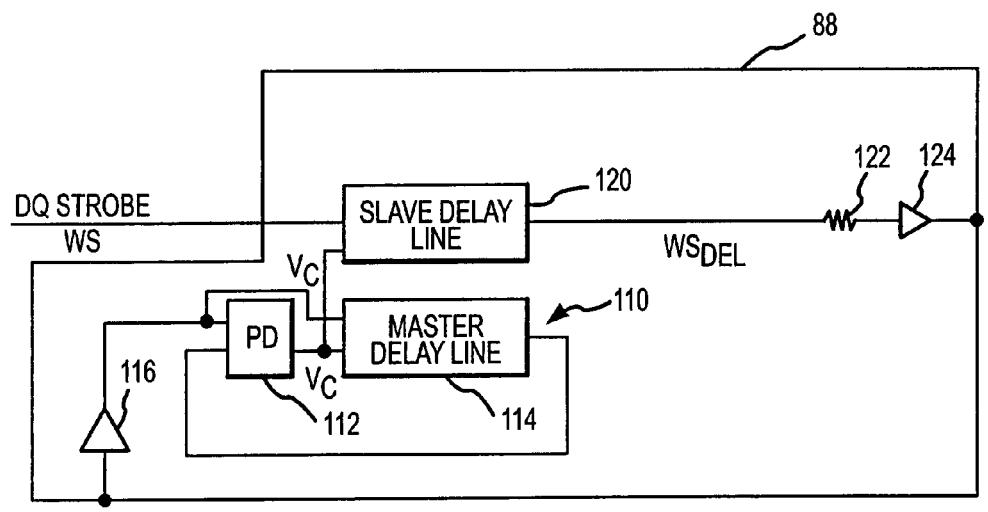
FIG. 5 is a block diagram of one embodiment of a clock delay circuit used in the data signal capture system of FIG. 3.

One embodiment of the quadrature delay circuit 88 is shown in FIG. 5. The quadrature delay circuit 88 includes a delay-locked loop 110 formed by a phase detector 112 and a master delay line 114. The phase detector 112 has a first input that receives the system clock CLK signal through a driver 116 and a second input that receives the output of the master delay line 114. As is a well-known in the art, the phase detector 112 generates a control signal $V_C$ corresponding to the difference between the phase of the CLK signal and the phase of the signal at the output of the master delay line 114. The master delay line 114 receives the CLK signal and propagates it through the delay line 114 with a delay that is set by the control signal $V_C$. In operation, the phase detector 112 adjusts the control signal $V_C$ to minimize the difference between the phase of the CLK signal and the phase of the signal at the output of the master delay line 114. This is accomplished by the control signal $V_C$ adjusting the delay of the master delay line 114 to correspond to either one-half of a period or an entire period of the CLK signal.

The quadrature delay circuit 88 also includes a slave delay line 120 that may use circuitry that is similar to the circuitry used in the master delay line 114. The slave delay line 120 receives the write strobe WS signal and outputs a delayed write strobe WS and signal. The delay of the slave delay circuit 120 is controlled by the same control signal $V_C$ that controls the delay of the master delay line 114. However, using conventional means, the slave delay line 120 has a delay that is a fixed sub-multiple of the delay of the master delay line 114. For example, if the master delay line 114 includes N delay elements (not shown) that delay the CLK signal by 360 degrees, the slave delay line 120 may include N/4 of those same delay elements. As a result, the slave delay line 120 will generate the $WS_{DEL}$ signal with a delay from the WS signal of 90 degrees. The $WS_{DEL}$ signal is coupled to the clock input of the deserializer capture logic 60 through a interconnect 122 and a driver 124. The propagation delay through the interconnect 122 and driver 124 compensates for the propagation delay through the interconnect 98 and driver 100 in the command decoder 70 (FIG. 4).

Figure 6:
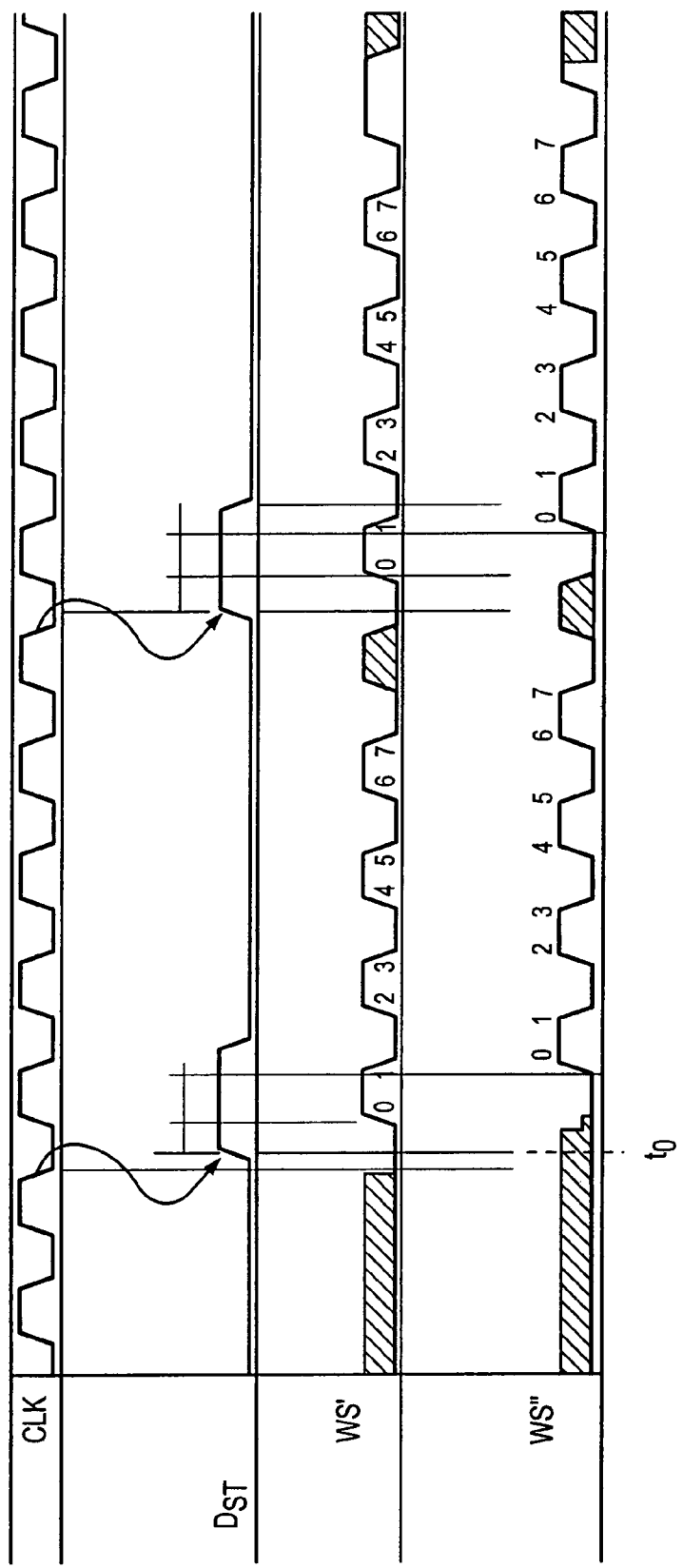
FIG. 6 is a timing diagram showing some of the signals that are present in the data signal capture system of FIG. 3.

The operation of the system 10 shown in FIG. 3 will now be explained with reference to the timing diagram of FIG. 6. As shown in FIG. 6, the $D_{ST}$ signal transitions active high at time $t_0$ in synchronism with a falling edge of the system clock CLK signal when valid write data is applied to the data bus terminals 14 (FIG. 3). Prior to that time t0, the write strobe WS signal transitions one or more times in a preamble so that, by the time the first data signals are applied to the data bus terminals 14, the transitions of the write strobe WS are well defined and occur at the proper times. Two versions of the write strobe signal WS are shown in FIG. 6. The write strobe signal WS' leads the system clock CLK signal by 90 degrees externally but is aligned to CLK after the delay circuit internally, and thus represents the earliest timing of the write strobe WS signal allowed by typical SDRAM timing specifications. The write strobe signal WS" lags the system clock CLK signal by 90 degrees but is lagging CLK by 180 degrees after the internal delay circuit, and thus represents the latest timing of the write strobe WS signal allowed by typical SDRAM timing specifications.

After the $D_{ST}$ signal transitions active high, the first rising edge of the write strobe WS signal latches the first write data signals corresponding to the first write bit into the data latch 38 (FIG. 3). Thereafter write data signals are captured by the latch 38 on each transition of the write strobe WS signal. It should be noted that the rising edge of the write strobe WS signal following the preamble occurs after the $D_{ST}$ signal transitions high regardless of whether the write strobe WS signal has the earliest timing, i.e., WS', or the latest timing, i.e., WS". In particular, by delaying the write strobe signal by 90 degrees to obtain the $CLK_{DEL}$ signal that operates the capture logic 60, the first transition of the early write strobe WS' signal after the preamble occurs after the $D_{ST}$ signal transitions high, and is therefore used to capture $D_{ST}$ generated by the CLK domain. This then starts deserialization on the correct clock transition.

Figure 7:
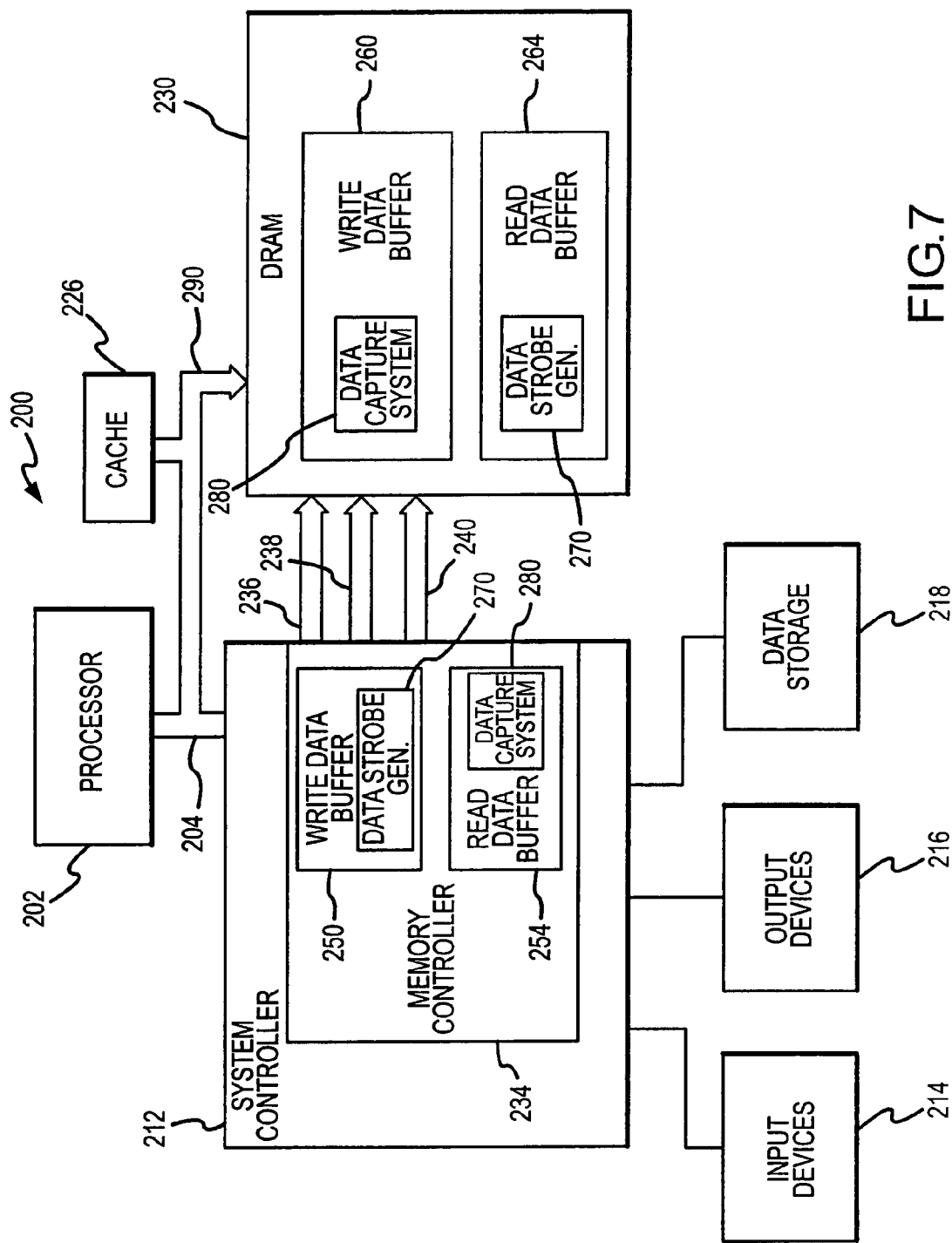
FIG. 7 is a block diagram of a computer system having a memory controller and a memory device, both of which use an embodiment of the data signal capture system of FIG. 3.

Although the foregoing explanation of the data capture system 10 has been explained in the context of a system for capturing write data signals in a SDRAM, it should be understood that it is also applicable to a system for capturing read data signals in a memory controller with slight variations that will be apparent to one skilled in the art. A computer system 200 employing systems for capturing both read data signals and write data signals is shown in FIG. 7. The computer system 200 includes a processor 202 for performing various computing functions, such as executing specific software to perform specific calculations or tasks. The processor 202 includes a processor bus 204 that normally includes an address bus, a control bus, and a data bus. The processor 202 is coupled through the processor bus 204 to a system controller 212. In addition, the computer system 200 includes one or more input devices 214, such as a keyboard or a mouse, coupled to the processor 202 through the system controller 212 to allow an operator to interface with the computer system 200. Typically, the computer system 200 also includes one or more output devices 216 coupled to the processor 202 through the system controller 212, such output devices typically being a printer or a video terminal. One or more data storage devices 218 are also typically coupled to the processor 202 through the system controller 212 to allow the processor 202 to store data in or retrieve data from internal or external storage media (not shown). Examples of typical storage devices 218 include hard and floppy disks, tape cassettes, and compact disk read-only memories (CD-ROMs). The processor 202 is also typically coupled to cache memory 226, which is usually static random access memory ("SRAM").

The system controller 212 also includes a memory controller 234, which is coupled to an SDRAM 230 through a control bus 236, an address bus 238, and a data bus 240. According to one embodiment of the invention, the memory controller 234 includes a write data buffer 250 and a read data buffer 254, both of which are coupled to the data bus 240. Similarly, the SDRAM 230 also includes a write data buffer 260 and a read data buffer 264, both of which are coupled to the data bus 240. The write data buffer 250 of the memory controller 234 and the read data buffer 264 of the SDRAM 230 include conventional data strobe generators 270 for generating a preamble of extra write strobe transitions and read strobe transitions, respectively, prior to generating write strobe transitions and read strobe transitions, respectively, that are used for capturing write data signals and read data signals, respectively. The write data buffer 260 in the SDRAM 230 and the read data buffer 254 in the memory controller 234 include data capture systems 280 of the type shown in FIGS. 3-5 that are used to capture write data signals and read data signals, respectively, in the SDRAM 230 and the memory controller 234, respectively. The data capture system 280 in the read data buffer 254 in the memory controller 234 differs slightly from the write data buffer 260 used in the SDRAM 230. As previously explained, in the write data buffer 260 used in the SDRAM 230, the command decoder 70 (FIG. 3) uses a write latency delay circuit 96 (FIG. 4) that outputs the $D_{ST}$ signal with a delay corresponding to the latency of the SDRAM 230 after receiving the write command. In the read data buffer 254 in the memory controller 234, the write latency delay circuit 96 outputs the $D_{ST}$ signal with a delay corresponding to the delay between the memory controller 234 issuing the read command and the receipt of the resulting read data signals at the SDRAM 230.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A memory system, comprising:
a memory controller having a first group of terminals, a second group of terminals, and a data strobe terminal, the memory controller being operable to output memory command signals and address signals from the terminals in the first group, write data signals from the terminals in the second group, and a write data strobe from the data strobe terminal having transitions that are synchronized to the write data signals, the memory controller being operable to generate at least one transition of the write data strobe immediately prior to generating the transitions that are synchronized to the write data signals, the memory controller further being operable to receive and process read data signals received from the terminals in the second group in synchronism with transitions of a read data strobe received from the data strobe terminal;
a memory device having a first group of terminals, a second group of terminals, and a data strobe terminal, the memory device being operable to process memory command signals and address signals received from the terminals in the first group, to store write data corresponding to write data signals received from the terminals in the second group, and to process a write data strobe received from the data strobe terminal, the memory device being operable to output the read data signals from the terminals in the second group in synchronism with the read data strobe received from the data strobe terminal, the memory device further comprising:
  a decoder coupled to the terminals in the first group to receive the memory command signals, the decoder being operable to decode the command signals and to determine if the command signals correspond to a write command, the decoder being operable to generate a data start signal after a delay period from receiving the memory command signals corresponding to a write command;
  a data latch circuit having data input terminals coupled to the terminals in the second group to receive the write data signals and a clock input terminal coupled to the data strobe terminal of the memory device to receive the write data strobe signal, the data latch circuit being operable to capture the received write data signals responsive to respective transitions of the write data strobe signal;
  a control circuit coupled to the data latch circuit to receive the write data signals captured by the data latch circuit, the control circuit outputting the write data signals captured by the data latch circuit responsive to receiving the data start signal; and
  a bus system coupling the first group of terminals of the memory controller to the first group of terminals of the memory device, the bus system further coupling the second group of terminals of the memory controller to the second group of terminals of the memory device.

2. The memory system of claim 1, wherein the decoder comprises:
a command capture latch having data inputs coupled to the terminals in the first group to receive the memory command signals and a clock input coupled to receive a system clock signal, the command capture latch being operable to store the received command signals responsive to the system clock signal;
a logic circuit coupled to receive the memory command signals stored in the command capture latch, the logic circuit being operable to generate a start signal responsive to decoding a write command; and
a delay circuit coupled to receive the start signal from the logic circuit, the delay circuit being operable to generate the data start signal after a predetermined delay from receiving the start signal from the logic circuit.

3. A memory system, comprising:
a memory device having a first group of terminals, a second group of terminals, and a data strobe terminal, the memory device being operable to process memory command signals and address signals received from the terminals in the first group, to store write data corresponding to write data signals received from the terminals in the second group in synchronism with transitions of a write data strobe received from the data strobe terminal, the memory device being operable to output read data signals from the terminals in the second group in synchronism with transitions of a read data strobe coupled from the data strobe terminal, the memory device being operable to generate at least one transition of the read data strobe immediately prior to generating the transitions that are synchronized to the read data signals;
a memory controller having a first group of terminals, a second group of terminals, and a data strobe terminal, the memory controller being operable to output memory command signals and address signals from the terminals in the first group, write data signals from the terminals in the second group, and a write data strobe from the data strobe terminal having transitions that are synchronized to the write data signals, the memory controller further being operable to receive read data signals from the terminals in the second group in synchronism with a read data strobe received from the data strobe terminal, the memory controller further comprising:
  a decoder coupled to receive the memory command signals coupled to the terminals in the first group, the decoder being operable to decode the command signals and to determine if the command signals correspond to a read command, the decoder being operable to generate a data start signal after a delay period from receiving the memory command signals corresponding to a read command;
  a data latch circuit having data input terminals coupled to the terminals in the second group to receive the read data signals and a clock input terminal coupled to the data strobe terminal of the memory controller to receive the read data strobe signal, the data latch circuit being operable to capture the received read data signals responsive to respective transitions of the read data strobe signal;
  a control circuit coupled to the data latch circuit to receive the read data signals captured by the data latch circuit, the control circuit outputting the read data signals captured by the data latch circuit responsive to receiving the data start signal; and
a bus system coupling the first group of terminals of the memory controller to the first group of terminals of the memory device, the bus system further coupling the second group of terminals of the memory controller to the second group of terminals of the memory device.

4. The memory system of claim 3, wherein the decoder comprises:
a command capture latch having data inputs coupled to receive the memory command signals coupled to the terminals in the first group and a clock input coupled to receive a system clock signal, the command capture latch being operable to store the received memory command signals responsive to the system clock signal;

a logic circuit coupled to receive the memory command signals stored in the command capture latch, the logic circuit being operable to generate a start signal responsive to decoding a read command; and a delay circuit coupled to receive the start signal from the logic circuit, the delay circuit being operable to generate the data start signal after a predetermined delay from receiving the start signal from the logic circuit.

5. A computer system, comprising:

a processor having a processor bus;

a system controller coupled to the processor through the processor bus;

an input device coupled to the processor through the system controller, the input device being adapted to allow data to be entered into the computer system;

an output device coupled to the processor through the system controller, the output device adapted to allow data to be output from the computer system;

a memory controller included in the system controller, the memory controller having a first group of terminals, a second group of terminals, and a data strobe terminal, the memory controller being operable to output memory command signals and address signals from the terminals in the first group, write data signals from the terminals in the second group, and a write data strobe from the data strobe terminal having transitions that are synchronized to the write data signals, the memory controller being operable to generate at least one transition of the write data strobe immediately prior to generating the transitions that are synchronized to the write data signals, the memory controller further being operable to receive and process read data signals received from the terminals in the second group in synchronism with transitions of a read data strobe received from the data strobe terminal; and a memory device having a first group of terminals, a second group of terminals, and a data strobe terminal, the memory device being operable to process memory command signals and address signals received from the terminals in the first group, to store write data corresponding to write data signals received from the terminals in the second group, and to process a write data strobe received from the data strobe terminal, the memory device being operable to output the read data signals from the terminals in the second group in synchronism with the read data strobe received from the data strobe terminal, the memory device further comprising:

a decoder coupled to the terminals in the first group to receive the memory command signals, the decoder being operable to decode the command signals and to determine if the command signals correspond to a write command, the decoder being operable to generate a data start signal after a delay period from receiving the memory command signals corresponding to a write command;

a data latch circuit having data input terminals coupled to the terminals in the second group to receive the write data signals and a clock input terminal coupled to the data strobe terminal of the memory device to receive the write data strobe signal, the data latch circuit being operable to capture the received write data signals responsive to respective transitions of the write data strobe signal;

a control circuit coupled to the data latch circuit to receive the write data signals captured by the data latch circuit, the control circuit outputting the captured write data signals responsive to receiving the data start signal; and a bus system coupling the first group of terminals of the memory controller to the first group of terminals of the memory device, the bus system further coupling the second group of terminals of the memory controller to the second group of terminals of the memory device.

6. The computer system of claim 5, wherein the first group of terminals comprise a group of command terminals and a group of address terminals.

7. The computer system of claim 5, wherein the decoder comprises:

a command capture latch having data inputs coupled to the terminals in the first group to receive the memory command signals and a clock input coupled to receive a system clock signal, the command capture latch being operable to store the received command signals responsive to the system clock signal;

a logic circuit coupled to receive the memory command signals stored in the command capture latch, the logic circuit being operable to generate a start signal responsive to decoding a write command; and a delay circuit coupled to receive the start signal from the logic circuit, the delay circuit being operable to generate the data start signal after a predetermined delay from receiving the start signal from the logic circuit.

8. The computer system of claim 5, wherein the control circuit comprises:

a quadrature delay circuit coupled to the data strobe terminal to receive the write data strobe signal, the quadrature delay circuit being operable to generate a delayed strobe signal by delaying the data strobe signal by approximately one-quarter period of the period of a system clock signal; and an output circuit coupled to the data latch circuit to receive the write data signals captured in the data latch circuit, the output circuit outputting the captured write data signals responsive to the delayed strobe signal after receipt of the data start signal.

9. The computer system of claim 8, wherein the output circuit comprises a deserializer circuit coupled to the data latch circuit to receive and store a plurality of bits of the write data signals coupled in serial form to the deserializer, the deserializer being operable to output the stored plurality of bits of the write data signals in parallel form in synchronism with the delayed strobe signal responsive to the data start signal.

10. The computer system of claim 5, wherein the memory device is operable to generate at least one transition of the read data strobe immediately prior to generating the transitions that are synchronized to the read data signals, and wherein the memory controller further comprises:

a decoder coupled to receive the memory command signals coupled to the terminals in the first group, the decoder being operable to decode the command signals and to determine if the command signals correspond to a read command, the decoder being operable to generate a data start signal after a delay period from receiving the memory command signals corresponding to a read command;

a data latch circuit having data input terminals coupled to the terminals in the second group to receive the read data signals and a clock input terminal coupled to the data strobe terminal of the memory controller to receive the read data strobe signal, the data latch circuit being operable to capture the received read data signals responsive to respective transitions of the read data strobe signal;

a control circuit coupled to the data latch circuit to receive the read data signals captured by the data latch circuit, the control circuit outputting the captured read data signals responsive to receiving the data start signal.

11. The computer system of claim 5, wherein the memory device comprises a dynamic random access memory device.

12. A computer system, comprising:

a processor having a processor bus;

a system controller coupled to the processor through the processor bus;

an input device coupled to the processor through the system controller, the input device being adapted to allow data to be entered into the computer system;

an output device coupled to the processor through the system controller, the output device adapted to allow data to be output from the computer system;

a memory device having a first group of terminals, a second group of terminals, and a data strobe terminal, the memory device being operable to process memory command signals and address signals received from the terminals in the first group, to store write data corresponding to write data signals received from the terminals in the second group in synchronism with transitions of a write data strobe received from the data strobe terminal, the memory device being operable to output read data signals from the terminals in the second group in synchronism with transitions of a read data strobe coupled from the data strobe terminal, the memory device being operable to generate at least one transition of the read data strobe immediately prior to generating the transitions that are synchronized to the read data signals;

a memory controller included in the system controller, the memory controller having a first group of terminals, a second group of terminals, and a data strobe terminal, the memory controller being operable to output memory command signals and address signals from the terminals in the first group, write data signals from the terminals in the second group, and a write data strobe from the data strobe terminal having transitions that are synchronized to the write data signals, the memory controller further being operable to receive read data signals from the terminals in the second group in synchronism with a read data strobe received from the data strobe terminal, the memory controller further comprising:

a decoder coupled to receive the memory command signals coupled to the terminals in the first group, the decoder being operable to decode the command signals and to determine if the command signals correspond to a read command, the decoder being operable to generate a data start signal after a delay period from receiving the memory command signals corresponding to a read command;

a data latch circuit having data input terminals coupled to the terminals in the second group to receive the read data signals and a clock input terminal coupled to the data strobe terminal of the memory controller to receive the read data strobe signal, the data latch circuit being operable to capture the received read data signals responsive to respective transitions of the read data strobe signal;

a control circuit coupled to the data latch circuit to receive the read data signals captured by the data latch circuit, the control circuit outputting the read data signals captured by the data latch circuit responsive to receiving the data start signal; and a bus system coupling the first group of terminals of the memory controller to the first group of terminals of the memory device, the bus system further coupling the second group of terminals of the memory controller to the second group of terminals of the memory device.

13. The computer system of claim 12, wherein the first group of terminals comprise a group of command terminals and a group of address terminals.

14. The computer system of claim 12, wherein the decoder comprises:

a command capture latch having data inputs coupled to receive the memory command signals coupled to the terminals in the first group and a clock input coupled to receive a system clock signal, the command capture latch being operable to store the received memory command signals responsive to the system clock signal;

a logic circuit coupled to receive the memory command signals stored in the command capture latch, the logic circuit being operable to generate a start signal responsive to decoding a read command; and a delay circuit coupled to receive the start signal from the logic circuit, the delay circuit being operable to generate the data start signal after a predetermined delay from receiving the start signal from the logic circuit.

15. The computer system of claim 12, wherein the control circuit comprises:

a quadrature delay circuit coupled to the data strobe terminal to receive the read data strobe signal, the quadrature delay circuit being operable to generate a delayed strobe signal by delaying the data strobe signal by approximately one-quarter period of the period of a system clock signal; and an output circuit coupled to the data latch circuit to receive the read data signals captured in the data latch circuit, the output circuit outputting the captured read data signals responsive to the delayed strobe signal after receipt of the data start signal.

16. The computer system of claim 15, wherein the output circuit comprises a deserializer circuit coupled to the data latch circuit to receive and store a plurality of bits of the read data signals coupled in serial form to the deserializer, the deserializer being operable to output the stored plurality of bits of the read data signals in parallel form in synchronism with the delayed strobe signal responsive to the data start signal.

17. The computer system of claim 12, wherein the memory device comprises a dynamic random access memory device.

* * * * *

UNITED STATES PATENT AND TRADEMARK OFFICE
CERTIFICATE OF CORRECTION

PATENT NO.       : 7,558,133 B2  
APPLICATION NO.  : 11/901053  
DATED            : July 7, 2009  
INVENTOR(S)      : Joo S. Choi et al.

Page 1 of 1

It is certified that error appears in the above-identified patent and that said Letters Patent is hereby corrected as shown below:

In column 11, line 2, in Claim 10, after "signal;" insert -- and --.

Signed and Sealed this

Twenty-ninth Day of September, 2009

David J. Kappos  
*Director of the United States Patent and Trademark Office*